United States Patent
Lee et al.

(10) Patent No.: US 10,939,549 B2
(45) Date of Patent: Mar. 2, 2021

(54) SELF-TRANSFORMING FLEXIBLE FILM AND METHOD FOR PREPARING SAME

(71) Applicant: GWANGJU INSTITUTE OF SCIENCE AND TECHNOLOGY, Gwangju (KR)

(72) Inventors: Jongho Lee, Gwangju (KR); Pyo Kwak, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 246 days.

(21) Appl. No.: 15/775,293

(22) PCT Filed: Oct. 28, 2016

(86) PCT No.: PCT/KR2016/012243
§ 371 (c)(1),
(2) Date: May 10, 2018

(87) PCT Pub. No.: WO2017/082559
PCT Pub. Date: May 18, 2017

(65) Prior Publication Data
US 2018/0332703 A1    Nov. 15, 2018

(30) Foreign Application Priority Data
Nov. 10, 2015    (KR) .................. 10-2015-0157417

(51) Int. Cl.
*H05K 1/03*    (2006.01)
*G03F 7/00*    (2006.01)

(52) U.S. Cl.
CPC .......... *H05K 1/0393* (2013.01); *G03F 7/0035* (2013.01); *H05K 2201/0308* (2013.01); *Y10T 428/24802* (2015.01)

(58) Field of Classification Search
CPC .......... H05K 1/0393; H05K 2201/0308; G03F 7/0035; Y10T 428/24802
See application file for complete search history.

(56) References Cited

U.S. PATENT DOCUMENTS 5,538,902 A    7/1996    Izu et al.
6,640,432 B1 *    11/2003    Mathieu ............. G01R 1/07378
257/E23.021
7,458,816 B1    12/2008    Mathieu et al.

FOREIGN PATENT DOCUMENTS

JP    07099332 A    4/1995
JP    2009267286 A    11/2009
(Continued)

OTHER PUBLICATIONS

Hatanaka, Motohide, "Design and Fabrication of Multimaterial Flexible Mechanisms with Embedded Components" Stanford University PhD Dissertation, 2005. (Year: 2005).*

(Continued)

*Primary Examiner* — Gerard Higgins
(74) *Attorney, Agent, or Firm* — Brooks Kushman P.C.

(57) ABSTRACT

A self-transforming flexible electronic device, according to an embodiment of the present invention, comprises: a substrate having flexible properties and a flexible electronic device attached thereon; shape memory alloys provided on one lateral side of the substrate; and photoresists for fixing the shape memory alloys to the substrate, wherein the shape memory alloys are arranged on the substrate in the form of a plurality of lines, the photoresists are disposed in plurality along the extension direction of each shape memory alloy, and the shape memory alloys can be fixed inside the photoresists and at a predetermined distance away from the substrate.

7 Claims, 5 Drawing Sheets

(56) References Cited

FOREIGN PATENT DOCUMENTS

| KR | 100801353 B1 | 2/2008 |
| KR | 20080073617 A | 8/2008 |
| KR | 101241679 B1 | 3/2013 |

OTHER PUBLICATIONS

Korean Patent Office acting as International Search Authority, International Search Report issued for corresponding International Application No. PCT/KR2016/012243, dated Jan. 31, 2017, 3 pages.

* cited by examiner

SELF-TRANSFORMING FLEXIBLE FILM AND METHOD FOR PREPARING SAME

CROSS-REFERENCE TO RELATED APPLICATION

This application is the U.S. national phase of PCT Application No. PCT/KR2016/012243 filed on Oct. 28, 2016, which claims priority to KR Patent Application No. 10-2015-0157417 filed on Nov. 10, 2015, the disclosures of which are incorporated in their entirety by reference herein.

TECHNICAL FIELD

The present invention relates to a self-transforming flexible film and a method for manufacturing the same, and more particularly, to a self-transforming flexible film and a method for manufacturing the same, which are capable of improving deformation characteristics of a flexible electronic device when connected to a flexible electronic device, such as a flexible display, a flexible solar cell, and a flexible touch panel.

BACKGROUND ART

Recently, as the convergence of different technologies such as nanotechnology, biotechnology, information and communication technology, and energy environment technology has accelerated, research and development of high-performance electronic devices, such as wearable computers, realistic displays, human-friendly head-mounted displays, electronic paper, and flexible displays, which are foldable and applicable to the human body, is rapidly in progress.

In particular, flexible electronic devices are recognized as one of technologies that can lead the electronics industry in line with social and cultural demands for new forms of technology and services that are capable of improving the quality of life for the future, such as healthcare, safety, energy, and environmental issues. The flexible electronic device is a future-oriented technology and can be regarded as a human-friendly technology that is capable of changing and developing straight technology into curve technology and two-dimensional technology into three-dimensional technology.

The conventional flexible electronic device cannot be deformed by itself, and its shape is deformed by applying an external force thereto. However, recently, flexible electronic devices capable of being self-transformed by connecting an actuator such as a shape memory alloy have been developed.

A self-transforming flexible film constituting a self-transforming flexible electronic device is manufactured by combining a flexible substrate and a shape memory alloy. When the film is bent inwardly from the substrate through external force, the shape memory alloy is also bent and strained at the same time. The shape memory alloy has a characteristic of being recovered to a memory shape at a specific temperature even after deformation has occurred.

At this time, since the recovering force becomes larger as the strain of the shape memory alloy becomes larger, it is important to manufacture the shape memory alloy to have a structure that can be deformed as much as possible, so as to manufacture excellent self-transforming flexible electronic devices.

DISCLOSURE OF THE INVENTION

Technical Problem

Embodiments provide a self-transforming flexible electronic device having excellent self-transforming flexible characteristics through a structure of a self-transforming flexible film capable of increasing strain of a shape memory alloy.

Technical Solution

In one embodiment, a self-transforming flexible film includes: a substrate having flexible properties and a flexible electronic device attached thereon; shape memory alloys provided on one surface of the substrate; and photoresists for fixing the shape memory alloys to the substrate, wherein the shape memory alloys are arranged on the substrate in the form of a plurality of lines, and the photoresists are arranged in plurality along an extending direction of the shape memory alloys, and the shape memory alloys are fixed in the photoresists while being spaced apart from the substrate by a predetermined distance.

The photoresist may have a hexahedron shape and may be patterned to form a matrix on the substrate. The photoresists may have the same width, length, and height, and may have the same spacing in horizontal and vertical directions.

The shape memory alloy may be partially inserted into the photoresist.

In another embodiment, a method for manufacturing a self-transforming flexible film includes: preparing a substrate having flexible properties; applying and patterning a first photoresist on the substrate; arranging a shape memory alloy on the patterned first photoresist; applying a second photoresist on the substrate to cover the shape memory alloy; and patterning the second photoresist in the same shape as the first photoresist provided thereunder.

The shape memory alloy may be fixed by one photoresist in a line shape, and the plurality of shape memory alloys may be arranged along a row direction or a column direction of the first photoresist.

Advantageous Effects

Since the self-transforming flexible film according to the present invention is formed in a structure in which deformation of the shape memory alloy occurs more largely than in the prior art, the force to be recovered to the original shape can be further improved.

Since the self-transforming flexible electronic device including the self-transforming flexible film, according to the present invention, is more greatly deformed (bent) by external force than the conventional self-transforming flexible electronic device, it can be designed in a structure that can be further unfolded (recovered) when recovered to the original shape.

In the method for manufacturing the self-transforming flexible film according to the present invention, since the photoresist which can be used semi-permanently is patterned through the photolithography process, it is possible to manufacture the flexible film having an improved strain by a relatively simple process.

MODE FOR CARRYING OUT THE INVENTION

Although embodiments are described in detail with reference to the accompanying drawings, the present invention is not limited to the embodiments. Moreover, detailed descriptions related to well-known functions or configurations will be ruled out in order not to unnecessarily obscure subject matters of the present invention.

Figure 1:
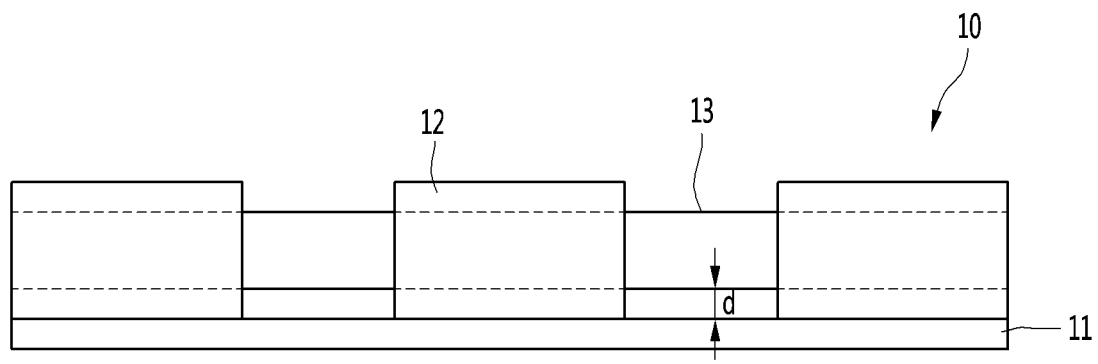
FIG. 1 is a diagram illustrating a self-transforming flexible film according to an embodiment.

FIG. 1 is a diagram illustrating a self-transforming flexible film according to an embodiment.

Referring to FIG. 1, the self-transforming flexible film 10 according to the embodiment is a combination of a substrate 11 and a shape memory alloy 13, and a photoresist 13 for fixing the shape memory alloy 13 may be provided on the substrate 11.

The shape memory alloy for deformation and recovery may be arranged and fixed on the substrate 11 provided in the self-transforming flexible film 10 of the embodiment. The shape memory alloy may be arranged in the form of a plurality of lines on the substrate 11. FIG. 1 illustrates a positional relationship with respect to one of the plurality of lines.

In the embodiment, a plurality of photoresists 12 may be arranged along the extending direction of the shape memory alloy 13, and the shape memory alloy 13 may be fixed in the photoresist 12 while being spaced apart from the substrate 11 by a predetermined distance d. The photoresists 12 are divided into a length sufficient to fix the shape memory alloy 13 and arranged on the substrate 11 so that a part of the shape memory alloy 13 is exposed between the photoresists 12.

The self-transforming flexible film 10 is manufactured such that a specific portion is folded or bent by external force. To this end, members constituting the self-transforming flexible film may be all made of flexible materials.

In the embodiment, the substrate 11 is preferably made of polyimide (PI), polyethylene terephthalate (PET), or polyethylene naphthalate (PEN), which can be flexibly deformed and recovered by external force. Table 1 shows the Young's modulus for each material.

TABLE 1

|  | PI | PET | PEN |
| --- | --- | --- | --- |
| Young's Modulus | 2.5 GPa | 2 GPa to 4 GPa | 5.0 GPa to 5.5 GPa |

The Young's modulus is a unique characteristic of a material which indicates the degree of elongation of a material. The Young's modulus refers to the modulus of elasticity which indicates the degree of elongation and deformation of an object when the object is stretched from both sides. The Young's modulus of the PI, the PET, and the PEN is about 2 GPa to 5 GPa, which is suitable for use as a substrate of a flexible electronic device as in the embodiment.

In the embodiment, the photoresist 12 is a material that can be used semi-permanently, and SU-8, INTERVIA, or the like is preferably used. Table 2 shows the Young's moduli of SU-8 and INTERVIA.

TABLE 2

|  | SU-8 | INTERVIA |
| --- | --- | --- |
| Young's Modulus | 2 GPa | 4 GPa |

The SU-8 and the INTERVIA have the Young's modulus of 2 GPa to 4 GPa, which is suitable for use as a material for bonding a substrate in a flexible electronic device as in the embodiment.

In the embodiment, nitinol, which is an alloy of nickel and titanium, may be used for the shape memory alloy, and the physical properties of nitinol are shown in Table 3.

TABLE 3

| Maximum Recovery Force (MPa) | 600 |
| --- | --- |
| Maximum Deformation Ratio (%) | 8 |
| Young's Modulus (GPa) | 28 (Martensite), 81 (Austenite) |

As for the physical properties of nitinol, the Young's modulus of the shape memory alloy (martensite) at room temperature at which deformation occurs is 28 GPa, and the Young's modulus of the heated shape memory alloy (austenite) has a slightly high value of 81 GPa. The Young's modulus is the unique characteristic of the material and does not change according to the shape of the material. However, the shape memory alloy manufactured in the form of a thin wire as in the embodiment can be more easily deformed under the same condition.

Figure 2:
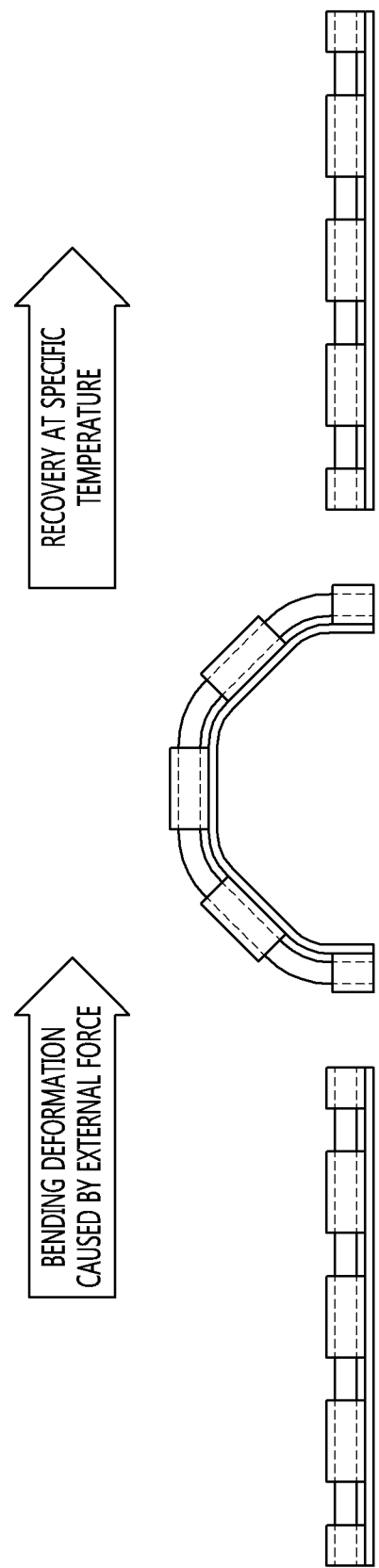
FIG. 2 is a diagram illustrating deformation and recovery of a self-transforming flexible film according to an embodiment.

FIG. 2 is a diagram illustrating deformation and recovery of a self-transforming flexible film according to an embodiment.

FIG. 2 illustrates a state in which deformation occurs when external force is applied to the self-transforming flexible film, and a state in which the self-transforming flexible film is recovered to an original shape at a specific temperature by the characteristics of the shape memory alloy.

When external force is applied to the self-transforming flexible film to allow the substrate to bend in a direction in which the substrate is positioned more inward than the shape memory alloy, the shape memory alloy is also bent and strained. When it is assumed that the shape memory alloy memorizes a flat shape, the deformed shape memory alloy is recovered to the memorized shape at a specific temperature and the entire self-transforming flexible film can be recovered to the original flat shape.

In the embodiment, as illustrated in FIG. 1, the degree of deformation may be larger at a portion where a part of the shape memory alloy is exposed between the photoresists, and the shape memory alloy is formed in a structure spaced apart from the substrate by a predetermined distance, thereby expecting that the strain at the exposed portion will become larger.

Since the photoresist used in the embodiment is a structure for partially fixing the shape memory alloy, it is necessary to consider the adhesion characteristic between the photoresist and the shape memory alloy. Table 4 shows the adhesion strengths of nickel, titanium, chromium, copper, and gold when the photoresist used in the embodiment was SU-8.

TABLE 4

|  | Ti | Cr | Ni | Cu | Au |
|---|---|---|---|---|---|
| Adhesion strength | 77.83 kPa | 76.79 kPa | 44.86 kPa | 46.97 kPa | 70.99 kPa |

Referring to Table 4, the adhesion strengths of nickel, titanium, chromium, copper, and gold were in the range of 44.86 kPa to 77.83 kPa. The adhesion strength within the above range is a range in which the shape memory alloy can be fixed without detaching from the photoresist even by repeated deformation and recovery of the self-transforming flexible film. This was actually confirmed through several operations in the process of manufacturing the self-transforming flexible film.

Nitinol (an alloy of nickel and titanium) may be used as the shape memory alloy. As shown in Table 4, since the adhesion strength of nickel and titanium with respect to the photoresist exhibits an adhesion strength that is not released when the flexible element is deformed and recovered. It can be determined that the shape memory alloy provided in the self-transforming flexible film of the embodiment can be stably fixed to the photoresist.

Figure 3:
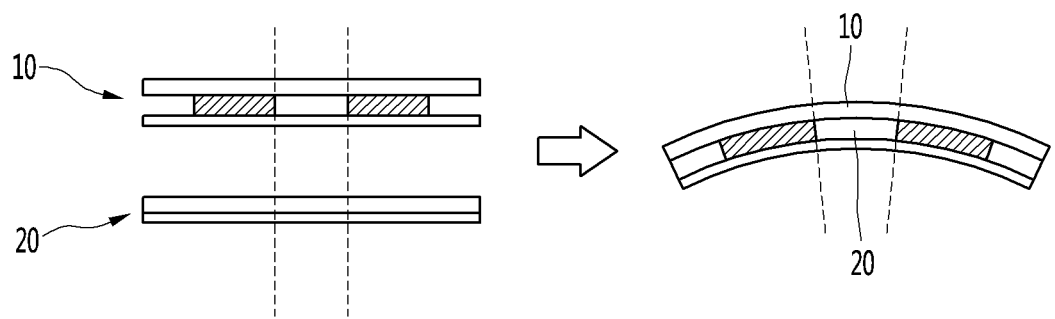
FIG. 3 is a diagram illustrating strains of self-transforming flexible films according to the related art and the embodiment.

FIG. 3 is a diagram illustrating strains of self-transforming flexible films according to the related art and the embodiment.

Referring to FIG. 3, the self-transforming flexible film 20 according to the related art is a structure in which a substrate and a shape memory alloy are directly contacted and fixed, and the self-transforming flexible film 10 according to the embodiment is a structure in which a substrate and a shape memory alloy are fixed at a predetermined interval by a photoresist.

In the case of comparing the strains of the shape memory alloys in a state in which the two structures are bent at a certain angle, when assuming that the substrate is in the same position, the shape memory alloy in the self-transforming flexible film according to the embodiment is positioned higher, and when the substrate is bent at the same angle, the strain of the shape memory alloy provided in the self-transforming flexible film according to the embodiment is larger.

As the strain of the shape memory alloy becomes larger, the recovering force in the process of recovering to the original shape becomes higher. Thus, it is possible to manufacture a self-transforming flexible electronic device having better properties. The structure of the self-transforming flexible film according to the embodiment is a structure for maximizing the strain of the shape memory alloy, and it can be schematically seen from FIG. 3 that the structure in which the shape memory alloy is spaced apart from the substrate has a greater strain than the structure in which the shape memory alloy is in close contact with the substrate. This means that it can be utilized as an excellent self-transforming flexible element because of higher recovering force thereof.

Figure 4:
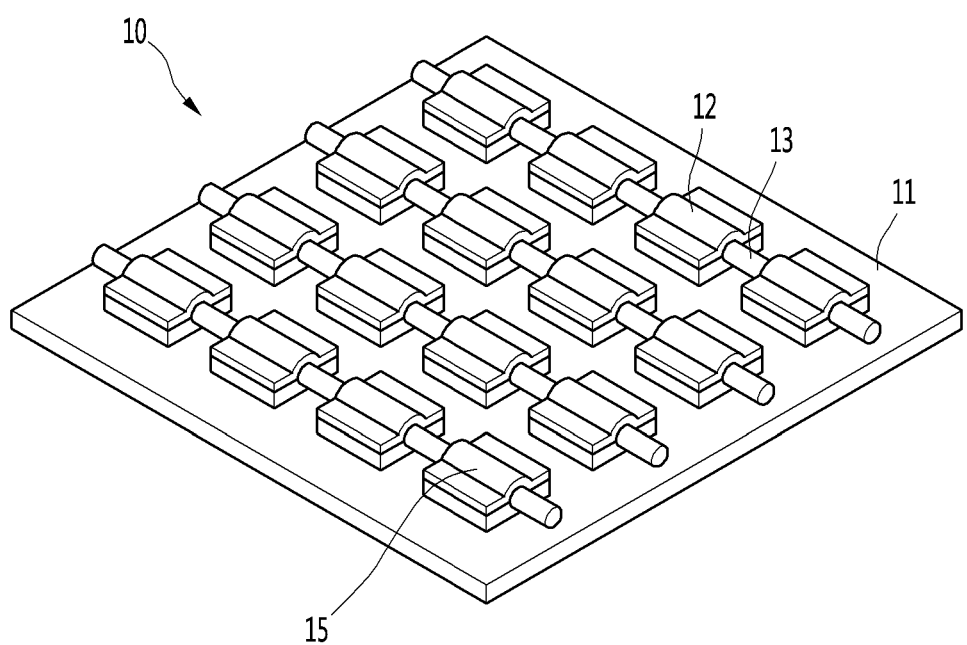
FIG. 4 is a diagram illustrating a self-transforming flexible film according to an embodiment.

FIG. 4 is a perspective view illustrating a self-transforming flexible film according to an embodiment.

Referring to FIG. 4, four shape memory alloys in the form of a line (wire) are arranged on a substrate 11 at a predetermined interval, and four photoresists are arranged and fixed on the substrate while being spaced apart from each other by a predetermined distance along the extending direction of each shape memory alloy. Each of the photoresists surrounds the shape memory alloy at a predetermined height, and the shape memory alloy is entirely fixed to the substrate, with spaced apart at a predetermined distance from the substrate. In particular, it can be seen that the shape memory alloy and the substrate are spaced apart from each other by a predetermined distance through a region located between the respective photoresists.

The structure of the above-described self-transforming flexible film is merely an example, and the number of shape memory alloys and photoresists, the distance between the shape memory alloys, and the distance between the photoresists may be variously changed depending on the structure of the display to be applied.

Figure 5:
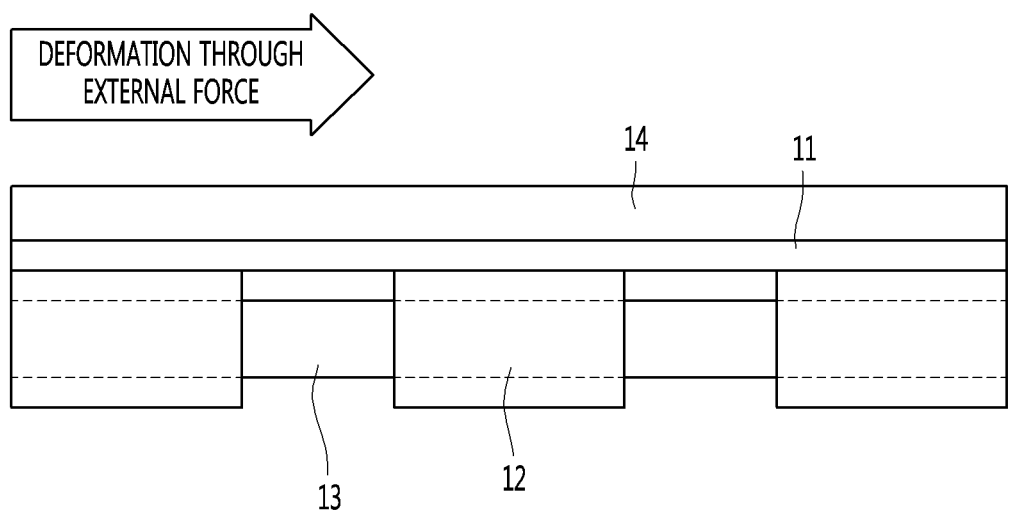
FIG. 5 is a diagram illustrating a self-transforming flexible electronic device according to an embodiment.

FIG. 5 is a diagram illustrating a self-transforming flexible electronic device 14 according to an embodiment.

Referring to FIG. 5, a self-transforming flexible electronic device is manufactured by bonding an element layer to the above-describing self-transforming flexible film. A self-transforming flexible film as in the embodiment is attached to one surface of the substrate, with the substrate 11 as a boundary, and a flexible electronic device 14 such as a flexible display may be bonded to the other surface of the substrate.

Figure 6:
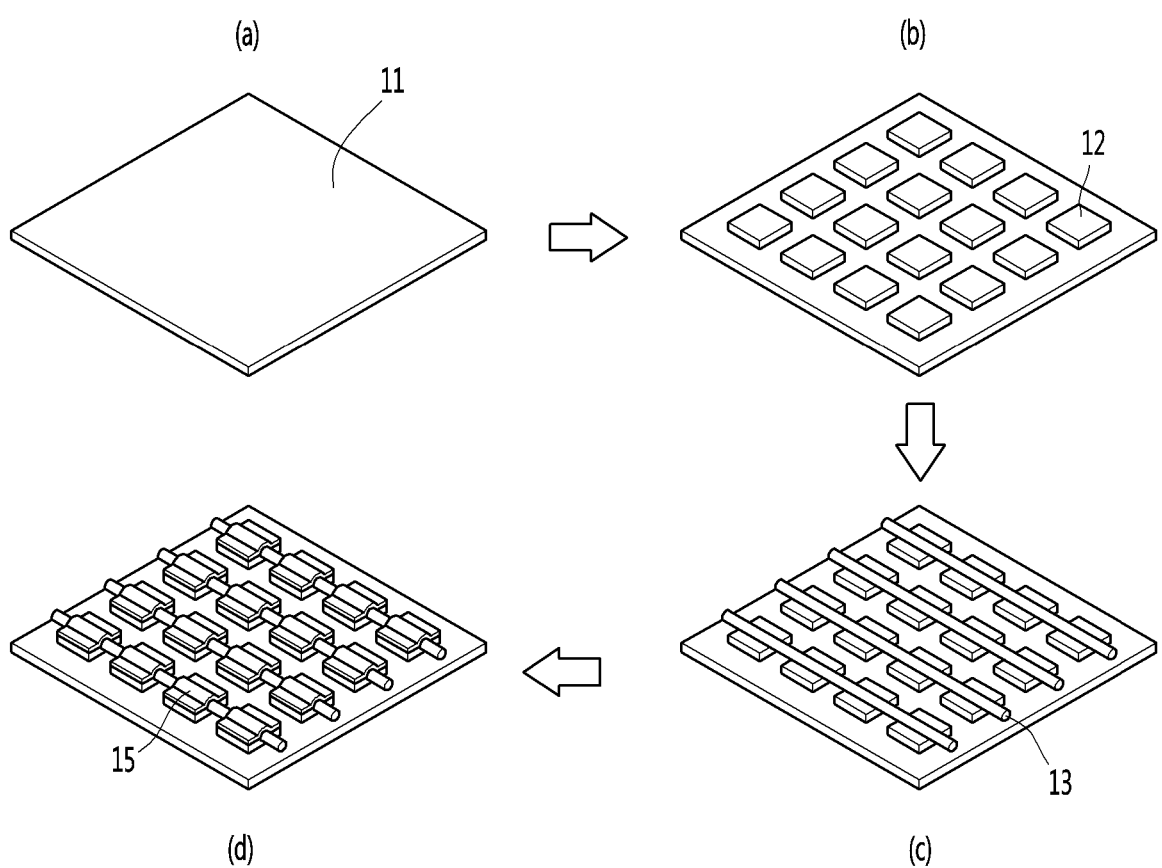
FIG. 6 is a diagram illustrating a method for preparing a self-transforming flexible film according to an embodiment.

FIG. 6 is a diagram illustrating a method for manufacturing a self-transforming flexible film according to an embodiment.

Referring to (a) of FIG. 6, a method for manufacturing a self-transforming flexible film according to an embodiment includes preparing a substrate 11 having flexibility so that a flexible film is stably bent when receiving external force. Then, a first photoresist in a liquid state is spin-coated on the substrate and photolithography process is performed to pattern the first photoresist into a plurality of hexahedrons having a constant height in a solid state as illustrated in (b) of FIG. 6. Each of the first photoresists may be patterned to have a predetermined number of rows and columns on the substrate, wherein the width, the length, and the height thereof are equal. The first photoresist may be patterned to be spaced apart by a predetermined distance to partially fix the shape memory alloy.

Referring to (c) of FIG. 6, the shape memory alloy having a line shape is arranged on the photoresist arranged as described above, and the shape memory alloy may include a photoresist in any one row or one row and may be positioned to pass through the center of each photoresist. After the shape memory alloy is arranged, both ends thereof are fixed with a bonding means for temporary fixing.

Referring to (d) of FIG. 6, a second photoresist is spin-coated on the substrate so that the currently exposed shape memory alloy is completely covered. As the second photoresist, the same photoresist as used in the process (b) may be used. Then, the second photoresist is patterned in the same manner as the hexahedron-shaped first photoresist formed in the process (b) through a photolithography process, and leaves in a solid state. At this time, a height of the first photoresist may be different from a height of the second photoresist.

When passing through the process (d), the line-shaped shape memory alloy is partly included in the photoresist, and the shape memory alloy and the substrate are spaced apart by a predetermined distance, thereby forming a fixed flexible film.

In order to confirm the strain of the self-transforming flexible film manufactured as described above, an experiment with other Comparative Examples was conducted.

First, comparison was performed on Comparative Example 1 in which a shape memory alloy was disposed on a substrate and a photoresist was applied and fixed on the upper surface thereof, Comparative Example 2 in which a shape memory alloy was arranged on a substrate and a photoresist was applied on the upper surface thereof and then partially patterned, and Example in which a photoresist is applied on a substrate and then partially patterned, a shape memory alloy is arranged thereon, and photoresists having the same shape are patterned again.

As a result of attempting to bending deformation with the same radius of curvature (3 mm), the flexible film in Comparative Example 1 was stiff as a whole and unfolded again by a certain angle. Compared to Comparative Example 1, Comparative Example 2 exhibited a greater degree of bending. This shows that the shape memory alloy was partially fixed by the patterning of the photoresist, so that more deformation occurred at the exposed portion of the shape memory alloy.

Example exhibited a greater degree of bending than that of Comparative Example 2, and it can be determined that the structure of the flexible film according to Example can more effectively maintain the deformation of the substrate and the photoresist, that is, the more bent state, as compared with Comparative Examples. That is, the flexible film according to Example can maintain a greater deformation with respect to the same external force, as compared with Comparative Example. This means that the internal shape memory alloy is more deformed. It can be understood that the recovering force corresponding to the strain is also increased, so that the recovery to the original shape is also easy.

As described above, in the self-transforming flexible film and the self-transforming flexible electronic device using the same, according to the embodiments, the shape memory alloy have a greater degree of deformation (bending) by the external force than the conventional shape memory alloy. Thus, since it is designed in a structure that can be further unfolded (recovered) when recovered to the original shape, it is applicable to a device in which a solar cell or a flexible shape is to be implemented.

Additionally, although various embodiments of the present invention have been particularly shown and described, the present invention is not limited to the above-mentioned specific embodiments and it should be understood by those skilled in the art that various modified embodiments are possible without departing from the technical idea and outlook of the present invention.

INDUSTRIAL APPLICABILITY

In the method for manufacturing the self-transforming flexible film according to the present invention, the photoresist which can be used semi-permanently is patterned through the photolithography process, and thus it is possible to manufacture the flexible film having the improved strain by a relatively simple process. Therefore, the present invention is industrially applicable.

The invention claimed is:

1. A self-transforming flexible electronic device comprising:
   a substrate having flexible properties and a flexible electronic device attached to one surface of the substrate;
   shape memory alloys provided on another surface of the substrate; and
   a plurality of photoresists arranged on the substrate, wherein the plurality of photoresists fix the shape memory alloys to the substrate,
   wherein the shape memory alloys are arranged on the substrate in the form of a plurality of lines, and
   the plurality of photoresists are arranged along an extending direction of the shape memory alloys, and the shape memory alloys are fixed in the plurality of photoresists while being spaced apart from the substrate by a predetermined distance.

2. The self-transforming flexible electronic device according to claim 1, wherein each of the plurality of photoresists has a hexahedron shape and is patterned to form a matrix on the substrate.

3. The self-transforming flexible electronic device according to claim 1, wherein the plurality of photoresists have the same width, length, and height, and have the same spacing in horizontal and vertical directions.

4. The self-transforming flexible electronic device according to claim 1, wherein each of the shape memory alloys is partially inserted into one of the plurality of photoresists.

5. The self-transforming flexible electronic device according to claim 1, wherein the substrate comprises polyimide (PI), polyethylene terephthalate (PET), or polyethylene naphthalate (PEN).

6. The self-transforming flexible electronic device according to claim 1, wherein each of the plurality of photoresists comprises a material having Young's modulus of 2 GPa to 4 GPa.

7. The self-transforming flexible electronic device according to claim 1, wherein each of the shape memory alloys comprises nitinol which is an alloy of nickel and titanium.

* * * * *